US005747997A

United States Patent [19]
Dahlberg et al.

[11] Patent Number: 5,747,997
[45] Date of Patent: May 5, 1998

[54] SPIN-VALVE MAGNETORESISTANCE SENSOR HAVING MINIMAL HYSTERESIS PROBLEMS

[75] Inventors: E. Dan Dahlberg, Roseville; Timothy J. Moran, Minneapolis, both of Minn.

[73] Assignee: Regents of the University of Minnesota, Minneapolis, Minn.

[21] Appl. No.: 655,222

[22] Filed: Jun. 5, 1996

[51] Int. Cl.$^6$ .................... G01R 33/09; G01C 17/00
[52] U.S. Cl. .................. 324/252; 338/38 R; 33/318; 33/355 R
[58] Field of Search ............... 324/207.21, 244, 324/249, 252, 260, 253; 338/32 R; 360/113, 111; 33/318, 355 R, 361, 352, 354; 368/14

[56] References Cited

U.S. PATENT DOCUMENTS

| | | | |
|---|---|---|---|
| Re. 30,166 | 12/1979 | Lee | 365/102 |
| 3,629,566 | 12/1971 | Brickner | 235/183 |
| 3,631,415 | 12/1971 | Aagard et al. | 340/174 YC |
| 3,698,010 | 10/1972 | Lee | 340/174 YC |
| 3,720,453 | 3/1973 | Lee et al. | 350/3.5 |
| 3,731,290 | 5/1973 | Aagard | 340/174 YC |
| 3,734,625 | 5/1973 | Aagard | 356/118 |
| 3,942,258 | 3/1976 | Stucki et al. | 33/361 |
| 4,019,924 | 4/1977 | Farrar | 33/361 |
| 4,280,158 | 7/1981 | di Niet | 360/113 |
| 4,343,026 | 8/1982 | Griffith et al. | 360/113 |
| 4,503,394 | 3/1985 | Kawakami et al. | 324/252 |
| 4,533,872 | 8/1985 | Boord et al. | 324/252 |
| 4,640,016 | 2/1987 | Tanner et al. | 33/356 |
| 4,847,584 | 7/1989 | Pant | 338/32 R |
| 4,918,824 | 4/1990 | Farrar | 33/361 |
| 4,996,621 | 2/1991 | Ruigrok et al. | 360/126 |
| 5,046,260 | 9/1991 | Wellhausen | 33/356 |
| 5,159,513 | 10/1992 | Dieny et al. | 360/113 |
| 5,161,311 | 11/1992 | Esmer et al. | 33/356 |
| 5,175,936 | 1/1993 | Sato | 33/354 |
| 5,199,178 | 4/1993 | Tong et al. | 33/361 |

(List continued on next page.)

OTHER PUBLICATIONS

"Applied Physics Systems of Mountain View, CA", *Model APS520 3 Axis Fluxgate Magnetometer System*, 2 catalog pages.

"ASC uMAG Hand–held Fluxgate Magnetometer catalog pages", 43–46.

"Billingsley Magnetics of Brookeville, Maryland 20833, one page".

"Fluxgate Magnetometer Fluxmaster", *Two-page product guide from Germany*.

"Honeywell 2300 Series Small Digital Magnetometer Price List Rev. Dec. 1995", *from the Solid State Electronics Center*, 11 pages, (1995).

"Macintyre Electronic Design Associates, Inc. (MEDA, Inc.)", *Domestic Price Schedule Effective 1 Jan. 1996* (4 pages).

(List continued on next page.)

*Primary Examiner*—Sandra L. O'Shea
*Assistant Examiner*—Jay M. Patidar
*Attorney, Agent, or Firm*—Schwegman, Lundberg, Woessner, & Kluth, P.A.

[57] ABSTRACT

The present invention provides a method and apparatus for utilizing spin valve magnetoresistance devices for the measurement of weak magnetic fields. The magnetoresistive element consists of a pinned ferromagnetic layer and a soft ferromagnetic layer separated by a thin spacer layer. The pinned layer may be pinned by high intrinsic coercivity, or by a neighboring antiferromagnet or high coercivity ferromagnet layer. An oscillating magnetic field is applied to the device. The amplitude of the excitation field is large enough to reverse the magnetization of the soft layer during each cycle, but small enough that the magnetization direction of the pinned layer is not much affected. In one embodiment, the applied field is applied using a current strip deposited onto the top of the other layers, so that the entire device can be produced on a single chip.

10 Claims, 14 Drawing Sheets

U.S. PATENT DOCUMENTS

| | | | |
|---|---|---|---|
| 5,206,590 | 4/1993 | Dieny et al. | 324/252 |
| 5,216,560 | 6/1993 | Brug et al. | 360/113 |
| 5,243,316 | 9/1993 | Sakakima et al. | 338/32 R |
| 5,247,278 | 9/1993 | Pant et al. | 338/32 R |
| 5,255,442 | 10/1993 | Schierbeek et al. | 33/361 |
| 5,277,991 | 1/1994 | Satomi et al. | 428/611 |
| 5,301,079 | 4/1994 | Cain et al. | 360/113 |
| 5,341,118 | 8/1994 | Parkin et al. | 338/32 R |
| 5,341,261 | 8/1994 | Dieny et al. | 360/113 |
| 5,366,815 | 11/1994 | Araki et al. | 428/611 |
| 5,422,571 | 6/1995 | Gurney et al. | 324/252 |
| 5,432,734 | 7/1995 | Hawano et al. | 365/158 |
| 5,434,733 | 7/1995 | Hesterman et al. | 360/113 |
| 5,435,070 | 7/1995 | Kilian | 33/361 |
| 5,440,233 | 8/1995 | Hodgson et al. | 324/252 |
| 5,442,508 | 8/1995 | Smith | 360/113 |
| 5,447,781 | 9/1995 | Kano et al. | 428/212 |
| 5,452,163 | 9/1995 | Coffey et al. | 360/113 |
| 5,457,752 | 10/1995 | Engdahl et al. | 381/190 |
| 5,462,809 | 10/1995 | Berkowitz | 428/546 |
| 5,465,185 | 11/1995 | Heim et al. | 360/113 |
| 5,469,054 | 11/1995 | Bicking | 324/207.2 |
| 5,475,304 | 12/1995 | Prinz | 324/207.21 |
| 5,476,680 | 12/1995 | Coffey et al. | 427/130 |
| 5,487,356 | 1/1996 | Li et al. | 117/99 |
| 5,491,606 | 2/1996 | Hesterman et al. | 360/113 |
| 5,493,465 | 2/1996 | Kamiguchi et al. | 360/113 |
| 5,498,298 | 3/1996 | Wecker et al. | 148/105 |
| 5,520,059 | 5/1996 | Garshelis | 730/862.335 |
| 5,521,500 | 5/1996 | Schuhl et al. | 324/249 |

OTHER PUBLICATIONS

"MG–7D Portable Hand–Held Magnetometer/Gaussmeter", *Walker Scientific Inc. of Walker Magnetics Group*, 2 pages.

Rene M. de Ridder, et al., "Orthogonal Thin Film Magnetometer Using the Anisotropic Magnetoresistance Effect", *IEEE Transactions on Magnetics, Abstract*, 20, 960–962, (Sep. 1984).

Gordon E. Fish, "Soft Magnetic Materials", *Proceedings of the IEEE*, vol. 78, No. 6, 947–972, (1990).

R. B. Fryer, "Thin Film Magnetic Sensors", *Honeyweller*, 32–34.

James Holmen, "The Development of Magnetic Thin–Film Sensors", 29–36.

W. Kwiatkowski, et al., "The Permalloy Magnetoresistive Sensors—Properties and Applications", *Warsaw Technical University*.

James E. Lenz, "A Review of Magnetic Sensors", *Proceedings of the IEEE*, vol. 78, No. 6, 973–989, (1990).

Bharat B. Pant, "Magnetoresistive Sensors", *Scientific Honeyweller, Fall 1987*, 29–34, (1987).

Eugene Paperno, et al., "Simltaneous Measurement of Two DC Magnetic Field Components by a Single Magnetoresistor", *IEE Transactions on Magnetics, 31*, 2269–2273, (May 1995).

Eugene Paperno, et al., "Supression of a Barkhausen Noise in Magnetoresistive Sensors Employing AC Bias", *IEEE Transactions on Magnetics, 31*, 3161–3163, (Nov. 1995).

S. S.P. Parkin, "Origin of Enhanced magnetoresistance of Magnetic Multilayers: Spin–Dependent Scattering from Magnetic Interface States", *Physical Review Letters, 71*, 1641–1644 (1993).

F. Primdahl, "The Fluxgate Magnetometer", *Phys. E. Sci. Instrum., 12*, (1979).

Jaquelin K. Spong, et al., "Giant Magnetoresistive Spin Valve Bridge Sensor", *IEEE Transactions on Magnetics, 32*, 366–371, (Mar. 1996).

George Wu, "Properties of Thin Magnetoresistive Films", *Honeyweller*, 34–36.

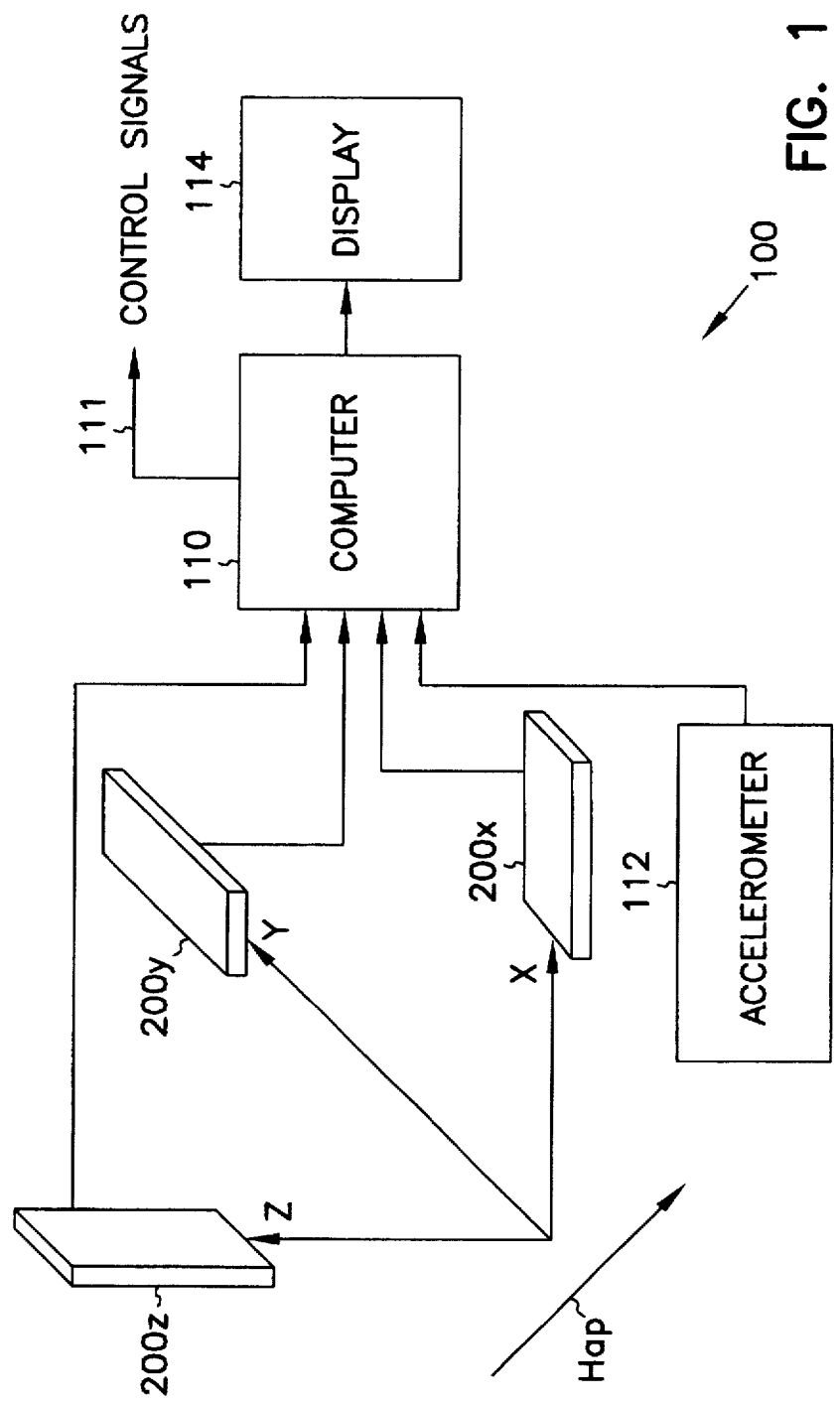

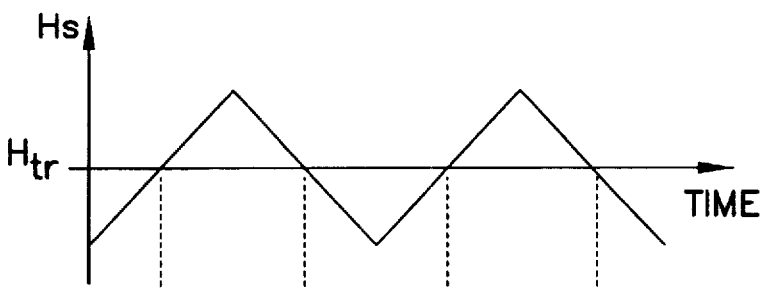
FIG. 5A
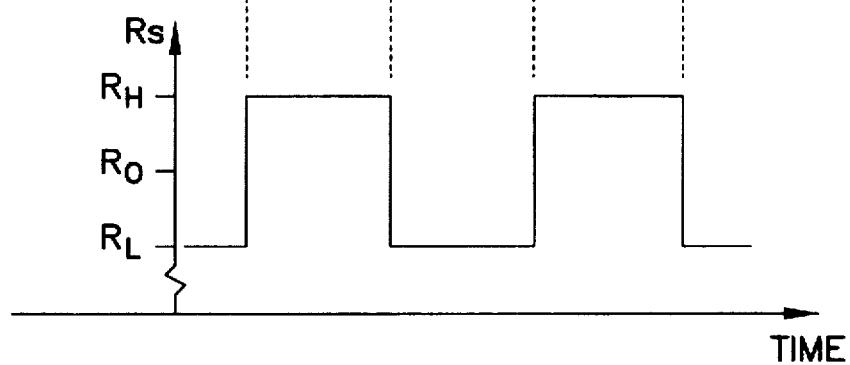
FIG. 5B
FIG. 5C
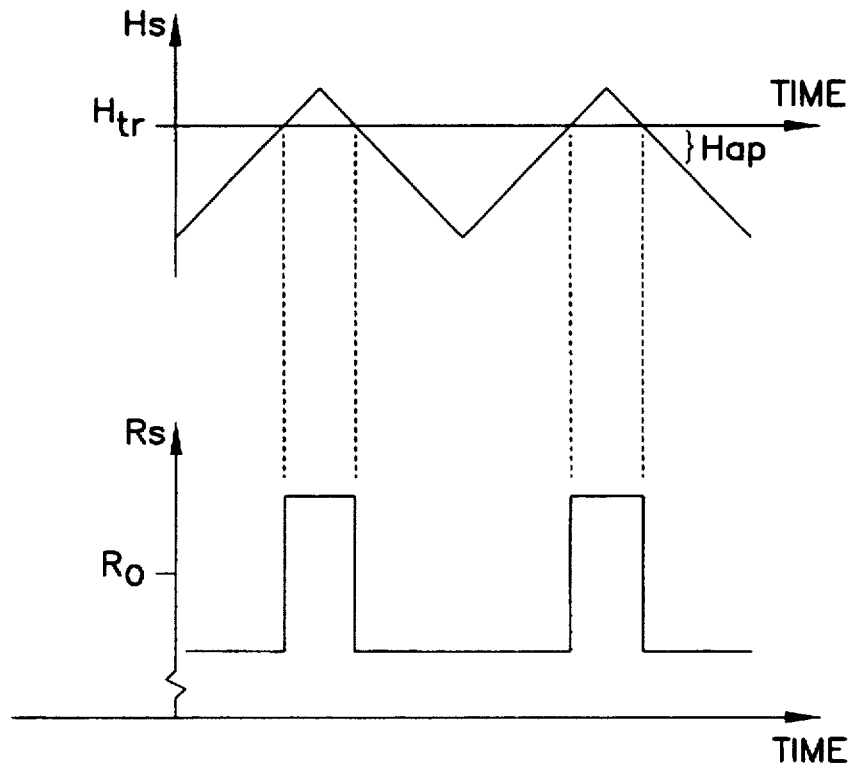
FIG. 5D

SPIN-VALVE MAGNETORESISTANCE SENSOR HAVING MINIMAL HYSTERESIS PROBLEMS

FIELD OF THE INVENTION

This invention relates to the field of magnetic sensors and methods, and more specifically to a method and apparatus of sensing weak magnetic fields using giant magnetoresistance spin-valve sensors and flux-gate techniques, useful as a compass.

BACKGROUND OF THE INVENTION

As discussed in U.S. Pat. No. 4,918,824 (issued Apr. 24, 1990 to Farrar), one fundamental vehicle navigation requirement is the direction in which the vehicle is traveling, and for about the last 2000 years the most fundamental navigation instrument has been the magnetic compass. For the great majority of its existence the compass has been a mechanical instrument that has slowly evolved over its great life span. The advent of an electronic compass did not occur until the 20th century, with its great electronic revolution.

The electronic compass is a single example of a general class of instruments called magnetometers, and more specifically it is classified as a vector magnetometer. This is because the earth's magnetic field is a 3 dimensional vector and the purpose of the compass is to determine the vehicles direction (magnetic heading) relative to the two horizontal components of this vector field.

While there have been many forms of magnetometers developed, most electronic compass systems use what is called a flux-gate magnetometer. The flux-gate vector magnetometer is based upon a high permeability core material where the earth's field, external to the core and along its axis, is alternately pulled into and released from the core material. This is what is referred to as gating the external field.

A complete analysis of the flux-gate mechanism has been reported by a number of authors, for example: D. I. Gordon, et al., IEEE Transactions On Magnetics, MAG 1, No. 4, Dec. 1965, "Factors Affecting the Sensitivity of Gama-Level Ring Core Magnetometers"; S. V. Marshall, IEEE Transactions On Magnetics, MAG 3, Sept. 1967, "An Analytic Model For the Flux-Gate Magnetometer"; F. Primdahl, IEEE Transactions On Magnetics, MAG 6, No. 2, June 1970, "The Gating Curves of Parallel and Orthogonal Flux-Gates"; J. R. Burger, IEEE Transactions On Magnetics, MAG 8, No. 4, Dec. 1972, "The Theoretical Output of a Ring Core Flux-Gate Magnetometer"; and D. I. Gordon et al., IEEE Transactions on Magnetics, MAG 8, No. 1, Mar. 1972, "Recent Advances in Flux-Gate Magnetometry".

As discussed in U.S. Pat. No. 5,199,178 (issued Apr. 6, 1993 to Tong, et al.), the magnetic fluxgate sensor of the ring-shaped core type is relatively good in detection sensibility. Its structure is simple and its subsequent signal-treating circuit is relatively simple. However, it has the following disadvantages due to the present manufacturing processes: First, it is difficult to fabricate a magnetic core with uniform cross section to ensure a constant magnetic flux.

Further, automatic winding of a uniform excitation coil on a ring-shaped core is difficult, and non-uniform coil winding will cause a magnetic azimuth error to occur.

Further, it is difficult to obtain a uniform winding distribution in the sensing coils. When this happens, the directions of the input axis of the sensing coils are displaced from the desired direction with the result that a magnetic azimuth error occurs.

Further, the sensor is too large in size for practical use (for example, a prior sensor has a diameter of 10–50 mm, and a thickness of 3 mm).

Further, a permalloy core, if not protected and supported, is easily broken by vibration and/or shock. A number of solutions have been proposed to alleviate the above problems.

For many magnetic materials, the electrical resistance depends on the angle between the current vector and the magnetization vector. Since the magnetization vector can be rotated by an applied magnetic field, the resistance depends on the applied magnetic field. This property is known as Anisotropic Magneto resistance (AMR). In all cases, the AMR change in resistance is identical for antiparallel magnetization states.

Around 1990, a class of layered magnetic materials were discovered which had larger changes in resistance when magnetic fields were applied. The term "Giant Magneto resistance" (GMR) is used to describe these materials because the changes in resistance (3–200%), are much larger than traditional AMR materials (0–2%). The term "spin valve Magneto resistance" is also used because the resistance is observed to depend on the magnetization directions of neighboring magnetic materials. Rotating the magnetization vector of one layer relative to a neighboring layer changes the total resistance, which is analogous to a valve in a water pipe.

A typical device that acts as a magnetic sensor using spin-valve magnetoresistance is illustrated in prior-art FIG. 3A. The upper ferromagnet layer is pinned by the antiferromagnet layer; the magnetization vector stays pointing in one direction to first approximation. The lower ferromagnet layer is designed to rotate freely in response to applied fields. Therefore, applied fields change the angle between the magnetization vector of the two layers. Changing this angle has a large effect on the resistance of the total structure, on the order of 2–8%. The hysteresis loop shown in FIG. 4B of the represents the switching off the soft layer.

This concept is described U.S. Pat. Nos. 5,206,590 (issued Aug. 23, 1994 to Dieny, et al.) and 5,159,513 (issued Oct. 27, 1992 to Dieny, et al.). In the most commonly described embodiment, the relative angle is designed to sit at the most sensitive point of the response curve while the sensor is moved past magnetic media. An applied field rotates the magnetization of the soft layer and produces a change in resistance. When used as a sensor for fields smaller than $H_c$, the magnetization state of the soft layer then depends on its magnetic history. This would seem to limit applications to those where the fields are larger than $H_c$.

It turns out that an oscillating excitation field enabling measurements of very weak fields has been used for decades in fluxgate magnetometers. A core of magnetic material is driven to two antiparallel saturation states at a high frequency with a primary coil. The transition of the core is sensed inductively by a secondary coil. This signal is then sensed by a lockin amplifier which produces a DC signal proportional to the applied field.

Recently, giant values, of magnetoresistance have been identified in multilayered structures of the form [F/NM] n where F is a thin layer of ferromagnetic material such as iron (Fe) or cobalt (Co) and NM is a non-magnetic spacer layer such as chromium (Cr) or copper (Cu). Observation of large values of magnetoresistance in such multilayers are found for structures in which the F layers are exchange coupled antiparallel to one another via the NM layer. Typically, magnetic fields in the range of several hundred Oe are required to obtain these changes in resistance.

One typical embodiment of a multilayered structure comprises repeated bilayers of a thin layer of a ferromagnetic material and a non-magnetic material. A thin layer of material is located within the layer of ferromagnetic material at a distance x from the interface between ferromagnetic layer and non-magnetic layer. The addition of this thin layer of material within the ferromagnetic layer increases the magnitude of the magnetoresistance without substantially increasing the applied magnetic field.

The purpose of the thin cobalt layer is to produce a localized region whose spin-dependent scattering properties are different from the layer of ferromagnetic material into which the localized regions are introduced. The thin layers of material have a thickness of a fraction of a monolayer to several monolayers or more of material, so these layers will be referred to as nanolayers. The materials for the nanolayers are metallic, and their characteristics are chosen based on the ferromagnetic materials into which they are introduced. The book, FERROMAGNETIC MATERIALS, Vol. 3, edited by E. P. Wohlfarth, North-Holland (1986) has on pages 766-9, Tables 1, 2 and 3 which report the residual resistivity and temperature dependence of resistivity for a number of impurities in nickel (Ni), Co, and Fe as well as spin dependent impurity scattering resistivities. These tables provide examples of materials that are candidates for use as the nanolayers for the respective ferromagnetic materials, as well. These and other materials may also be chosen because of their spin dependent electron scattering properties derived from induced strain, or introduced defects, or caused by the change in electronic band structure that the nanolayer introduces. Note that some of these materials are ferromagnetic and some of these materials are non-magnetic. Only the ferromagnetic materials are suitable for use as thin film layers.

One conventional AMR technique is described in "Simultaneous Measurement of Two DC Magnetic Field Components by a Single Magnetoresistor" by Paperno et al., IEEE transactions on Magnetics, Vol. 31, No. 3, page 2269-73, May 1995.

In the former, a square wave excitation signal is used, the magnetization is not driven to saturation, and the output is an AC signal.

There is a need for an magnetoresistive (MR) device that uses excitation fields in a self-contained magneto resistive device.

SUMMARY OF THE INVENTION

This invention provides a method and sensor for sensing weak magnetic fields using giant magnetoresistance spin-valve sensors and flux-gate techniques. In one embodiment, the sensor is used in a geomagnetic compass.

A technique is described for utilizing spin valve magnetoresistance devices for the measurement of weak magnetic fields. The magnetoresistive element consists of a pinned ferromagnetic layer and a soft ferromagnetic layer separated by a thin spacer layer. The pinned layer may be pinned by high intrinsic coercivity, or by a neighboring antiferromagnet or high coercivity ferromagnet layer. An oscillating magnetic field is applied to the device. The amplitude of the excitation field is large enough to reverse the magnetization of the soft layer during each cycle, but small enough that the magnetization direction of the pinned layer is not much affected. In one embodiment, the applied field is applied using a current strip deposited onto the top of the other layers, so that the entire device can be produced on a single chip.

BRIEF DESCRIPTION OF THE DRAWINGS

FIG. 1 is a isometric block diagram of a compass system 100 using three saturation-excited spin-valve magnetoresistance ("SESVMR") sensors 200.

FIG. 5A shows a graph of the sensed magnetic field $H_s$ varying with time due to the excitation field $H_{DRIVE}$ at the sensing element varying with time as a triangle wave.

FIG. 5B shows a graph of the sensed resistance $R_s$ varying with time as a square wave—due to the field $H_s$ passing above and below $H_{rr}$ corresponding to FIG. 5A.

FIG. 5C shows a graph of the sensed magnetic field $H_s$ varying with time due to the excitation field $H_{DRIVE}$ varying with time as a triangle wave, and with a DC shift in H.

FIG. 5D shows a graph of the sensed resistance $R_s$ varying with time as a square wave—due to the field $H_s$ passing above and below $H_{rr}$ corresponding to FIG. 5C.

DESCRIPTION OF PREFERRED EMBODIMENTS

Figure 2A:
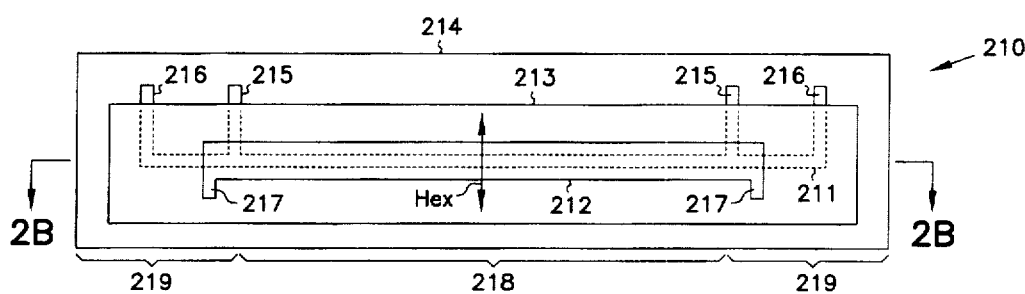
FIG. 2A is a top view showing a SESVMR sensor element 210.

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

FIG. 1 is a isometric block diagram of a compass system 100 using three saturation-excited spin-valve magnetoresistance ("SESVMR") sensors 200x, 200y, and 200z. FIG. 1 shows three orthogonal directions x, y, and z, that are, for example, fixed relative to a measurement frame of reference, say a vehicle, an aircraft, or a wrist-mounted electronic compass instrument that is measuring the geomagnetic filed of the earth. In one embodiment, compass system 100 is used to determine the direction of geomagnetic north, by measuring the x, y, and z components of the applied geomagnetic field, denoted $H_{ap}$. In the embodiment shown, signals representing the magnitude of the X, y, and z components are supplied to computer 110 by SESVMR sensors 200x, 200y, and 200z, respectively. In the embodiment shown, accelerometer 112 provides an indication of the vertical orientation of compass system 100, in order that computer 110 can determine the horizontal direction "north." In the embodiment shown, computer 110 drives a signal that controls display 114 for displaying an indication of the geomagnetic orientation of compass system 100, for example, providing an analog pointer to north, or providing a numerical angle, e.g., 32.8° from north. Also shown are control signals 111 which, in one embodiment, are used to drive auto-pilot navigation controls.

In another embodiment, compass system 100 includes only two orthogonally oriented SESVMR sensors 200. In such a system, mechanical means are employed to arrange the two SESVMR sensors in a horizontal plane, for example, a wrist-mounted compass system 100 is held horizontally by its user.

In yet another embodiment, non-computer-implemented electro-mechanical means (e.g., an analog circuit) are substituted for computer 110 used to convert the output signals from SESVMR sensors 200 into a usable display and/or control signal.

Figure 2B:
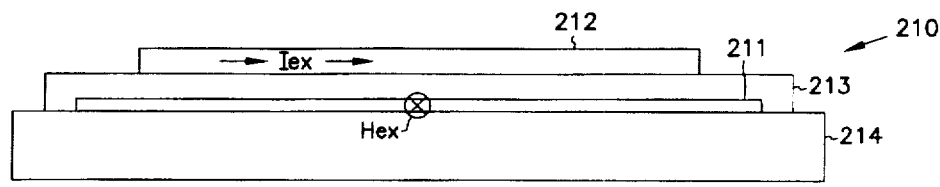
FIG. 2B is a side view showing a SESVMR sensor element 210.
Figure 2C:
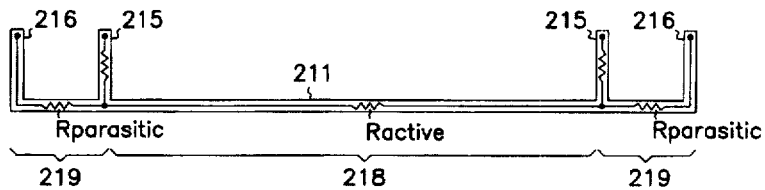
FIG. 2C is a top view showing a MR strip 211 and showing the active resistance and parasitic resistances and regions.

FIG. 2A is a top view, and FIG. 2B is a side view, each showing a SESVMR sensor element 210, including substrate 214, magnetoresistive ("MR") strip 211, insulating layer 213, and excitation strip 212. In one embodiment, MR strip includes a giant magnetoresistive (GMR) device. In one embodiment, the width of MR strip 211 is 10 microns, and the active region 218 is 20 to 2000 squares long (i.e., 200 to 20,000 microns, respectively, for a 10 micron wide strip). Here, the excitation strip 212 is typically a high-conductivity strip of copper, and typically 1 micron thick and 30 microns wide covering the active region 218 of MR strip 211. Excitation strip 212 is used to generate an magnetic excitation field $H_{DRIVE}$ in the directions shown through the active region 218 of MR strip 211. Connection terminals 217 provide electrical contact to excitation strip 212. The purpose of magnetic excitation field $H_{DRIVE}$ is explained below. In this embodiment MR strip 211 includes current-drive terminals 216 into which a sense drive signal is provided in order to induce a voltage drop across the active region 218 of MR strip 211, and voltage-sense terminals 215 used to sense the induced voltage drop. Due to the magnetoresistance of MR strip 211, the active resistance $R_{active}$ will vary as a function of magnetic field in the direction shown for $H_{EX}$. In one embodiment, the parasitic resistance $R_{parasitic}$ in the current-drive terminal 216 arms is minimized by keeping the length of those arms as short as possible, and the parasitic resistance $R_{parasitic}$ in voltage-sense terminal 215 arms is minimized by minimizing the current flow in those arms. FIG. 2C is a top view showing a MR strip 211 and showing the active resistance $R_{active}$ and parasitic resistances $R_{parasitic}$ and the active region 218 and parasitic regions 219.

In another embodiment, SESVMR sensor element 210 includes substrate 214, magnetoresistive ("MR") strip 211, insulating layer 213, and excitation strip 212, where the excitation strip 212 is place both above and below MR strip 211. This provides a coil-type magnetic field through MR strip 211. In yet another embodiment, an external coil is provided to provide this magnetic field.

Figure 3A:
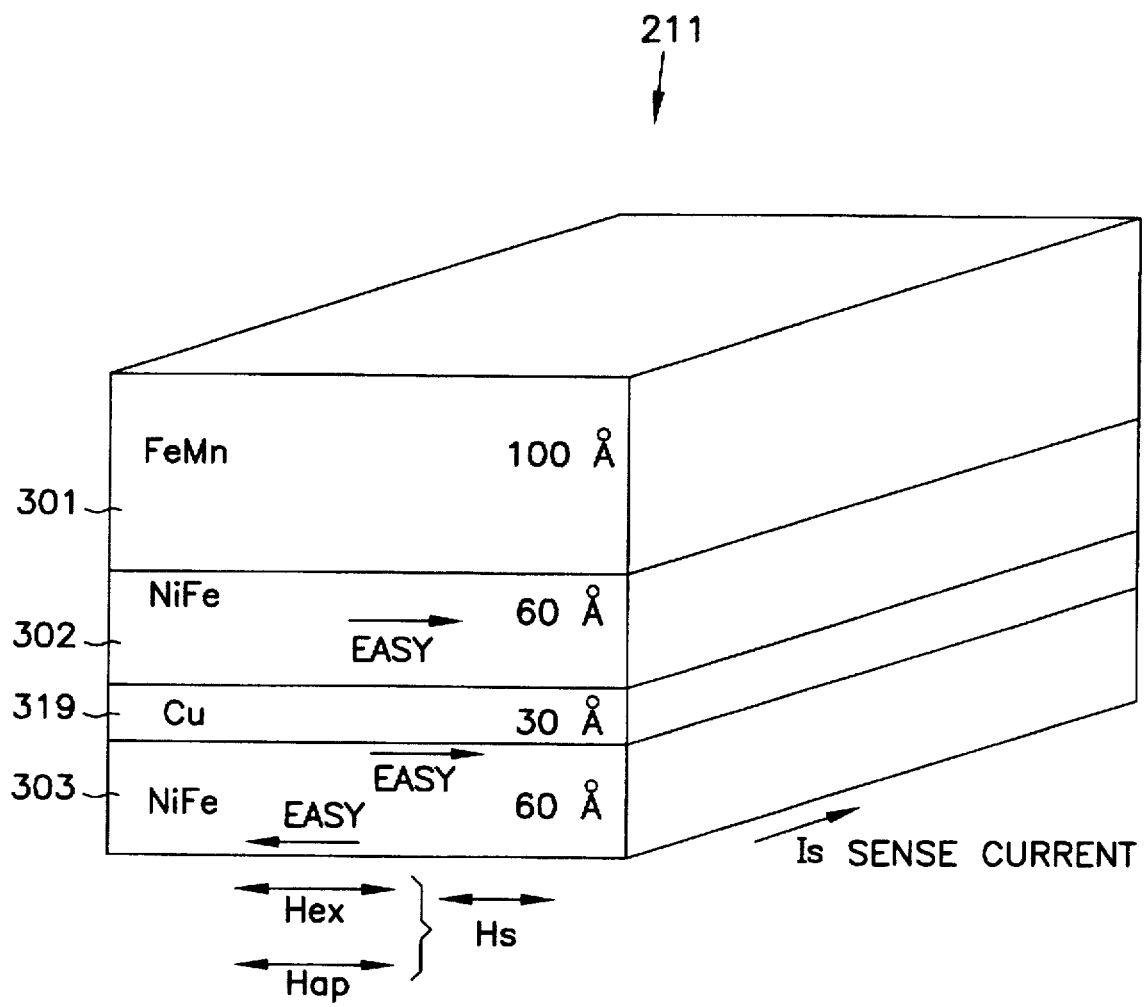
FIG. 3A is an isometric view showing a section of a prior-art MR strip 211, and the directions of sense current versus detected magnetic field.

FIG. 3A is an isometric view showing a section of one embodiment of MR strip 211, and the directions of sense current $I_s$ versus sensed or detected magnetic field $H_s$. The sensed magnetic field $H_s$ is the component in the direction shown, of the vector sum of the applied field $H_{ap}$ and the excitation magnetic field $H_{DRIVE}$. In this embodiment, MR strip 211 includes pinning layer 301 that is 100 Å of FeMn (typically 50% Fe and 50% Mn), pinned layer 302 that is 60 Å of NiFe (typically 80% Ni and 20% Fe), spacer layer 319 that is 30 Å of Cu, and soft layer 303 that is 60 Å of FeMn (typically 80% Ni and 20% Fe). Typically, MR strip 211 is heated in a DC applied magnetic field in order that pinning layer 301 and pinned layer 302 couple to produce and anneal an "easy" direction of magnetization in the direction shown.

Spin valve (or GMR) magnetoresistive structures often contain ferromagnetic layers designed to rotate easily in response to a magnetic field. Ideally, structures for applications have soft ferromagnetic layers which are as soft (i.e., easily rotated by an applied field) as possible, while also having the largest percentage resistance change due to the rotation of the soft layer. In previous devices these two properties cannot be optimized simultaneously. A common spin-valve structure (prior-art FIG. 3C) uses two strongly coupled ferromagnetic layers as the soft layer, each serving a purpose. The fixed magnetic layer is pinned by being located adjacent to a FeMn layer and also contains two strongly coupled ferromagnetic layers, but for this invention the soft layer design is more relevant. The thick permalloy ($Ni_{80}Fe_{20}$) layer is used since it is known to be a soft ferromagnetic material.

The thin Co (cobalt) layer is used at the boundary of the NiFe layer which is exposed to the pinned permalloy layer because it has been observed to increase the resulting magnetoresistance percentage. The mechanism for this enhancement by "Co dusting" remains an interesting puzzle.

Bulk materials can sometimes be softer than comparable thin films of the same materials. This suggests that increasing the thickness can increase the softness of magnetic materials, in at least some cases. However, typical thicknesses for the soft layer reported in the literature are less than 100 Å. This is because the GMR effect relies on current carriers traveling between the two ferromagnetic layers. If more material is present to carry current that is distant from the active interface, the total GMR will be decreased. Since increasing the thickness of the soft material too far will reduce the GMR percentage, there is a practical upper limit to the thickness of soft layers, which limits the sensitivity of the finished device to low-fields.

Another trend in the literature is that low-resistivity materials are usually used for the soft layer. While not stated explicitly, this is possibly because the GMR mechanism is maximum when the ratio of spin-dependent scattering to spin-independent scattering is large. In this case, the spin dependent scattering is that caused by the relative magnetization states while the spin independent scattering is that caused by all of the other "lossy" mechanisms in the material. Therefore, a low-resistance ferromagnetic material will have relatively little spin independent scattering and should produce a large GMR effect when used in a spin valve sandwich.

Figure 3B:
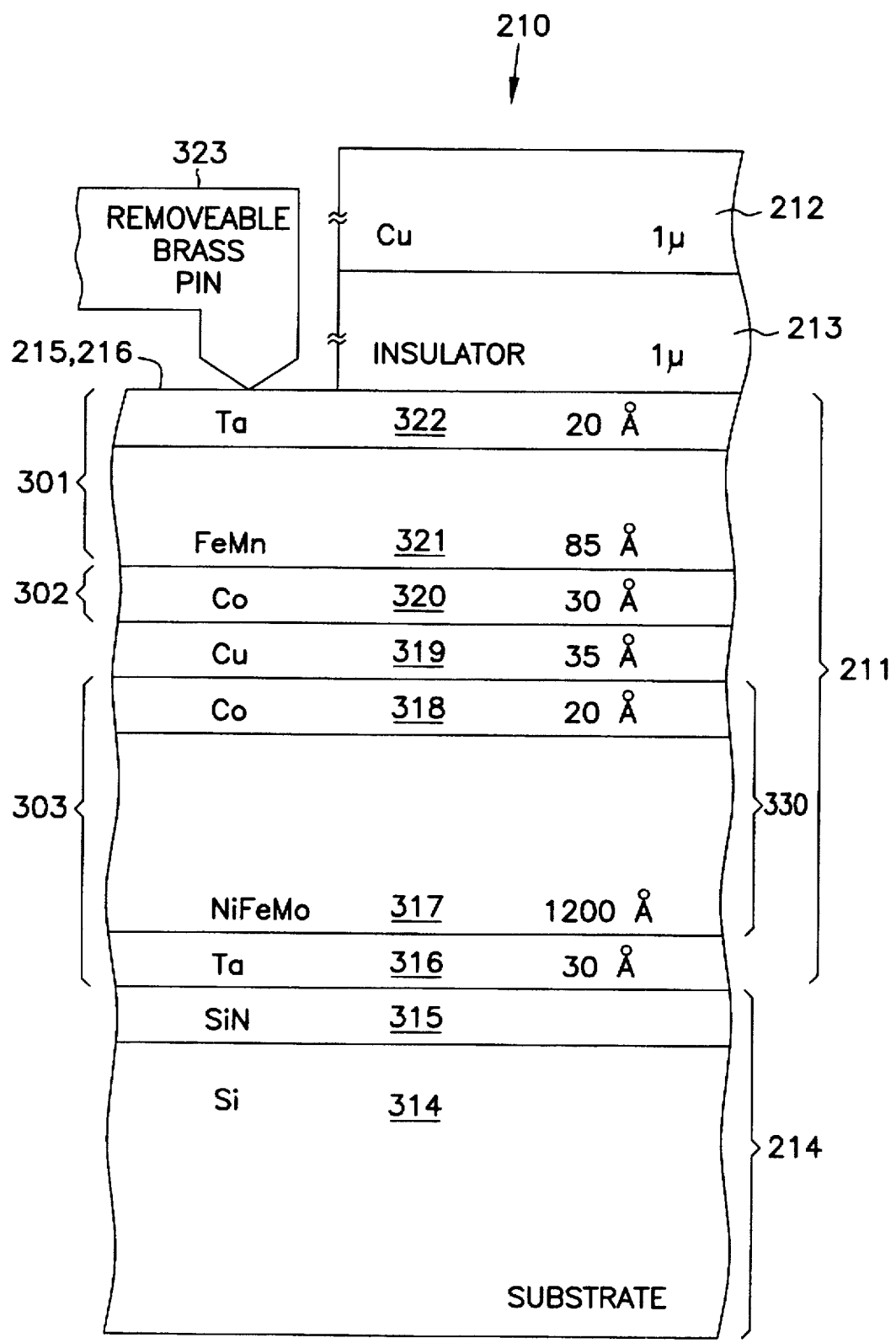
FIG. 3B is a cross-section view showing another embodiment of MR strip 211.
Figure 3C:
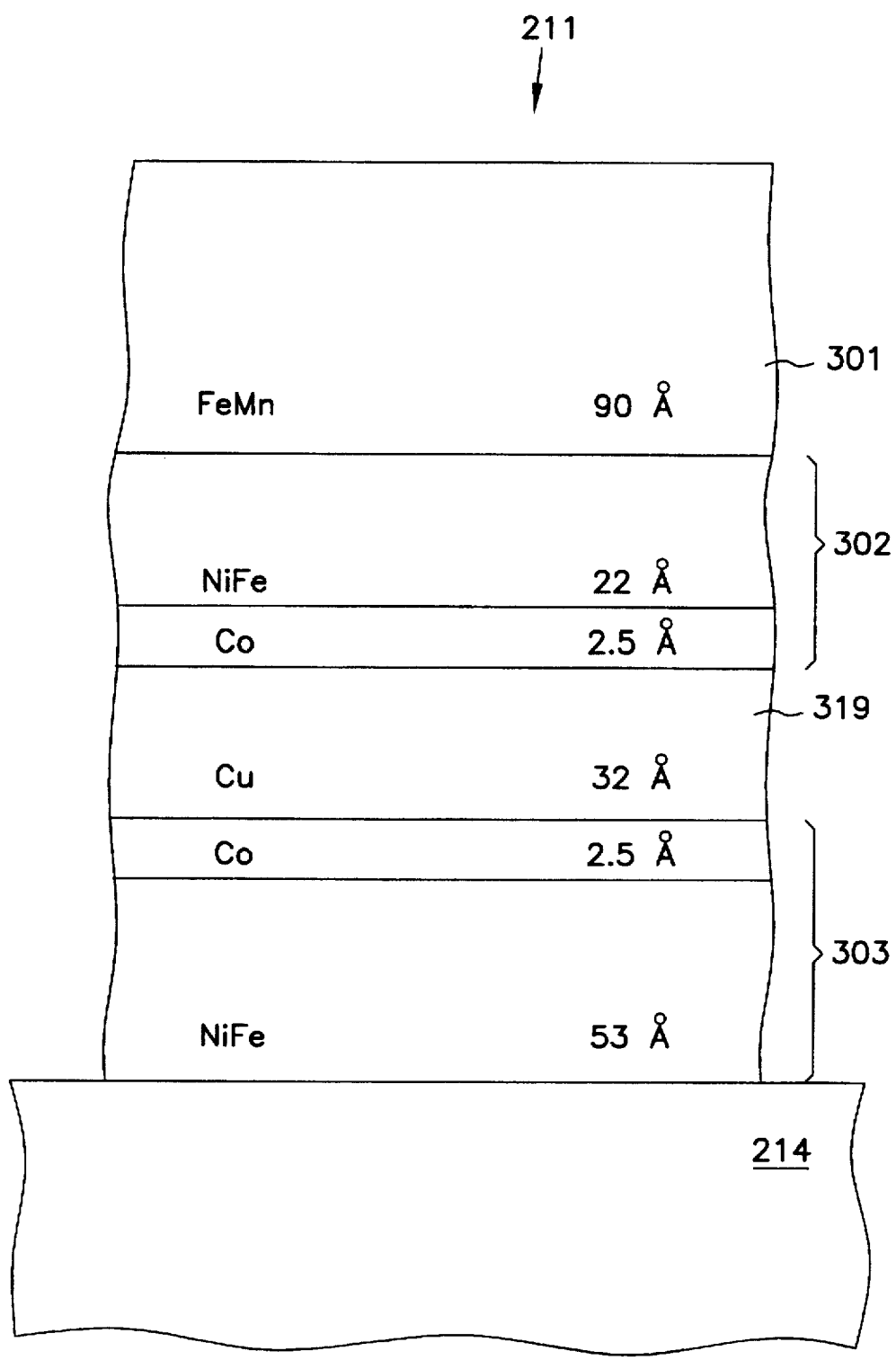
FIG. 3C is an isometric view showing a section of a prior-art MR strip 211.

The previous four paragraphs point toward four desirable properties for soft layers: they should principally include soft ferromagnetic material, they should have a thin coating of Co (cobalt) or Co alloy, they should be thin (less than approximately 100 Å), and they should include low-resistivity ferromagnetic materials. The last two conditions can be limiting factors for low-field switching characteristics. In one embodiment of the present invention, by violating both of these conditions simultaneously ON PURPOSE, one achieves superior low-field switching while still keeping a substantial GMR percentage. FIG. 3B is across-section view showing another embodiment of MR strip 211 having such an arrangement. In this embodiment, substrate 214 includes a silicon substrate 314 having a silicon nitride SiN layer 315. Soft layer 303 includes Ta layer 316 (in one embodiment, 30 Å tantalum), high-resistivity soft ferromagnetic layer 317 (in one embodiment, 1200 Å nickel-iron-molybdenum)(typically 80% Ni, 16% Fe, and 4% Mo), and low-resistivity ferromagnetic layer 318 (in one embodiment, 20 Å cobalt). Spacer layer 319 (in one embodiment, 30 Å copper; in other embodiments similar thicknesses of gold, silver, copper, or allows of these metals). Pinned layer 302 includes Co layer 320 (in one embodiment, 30 Å cobalt). Pinning layer 301 includes FeMn layer 321 (in one embodiment, 60 Å of FeMn)(typically 80% Ni and 20% Fe) and Ta layer 322 (in one embodiment, 20 Å tantalum used to prevent oxidation of lower layers). In the embodiment shown, a removable brass pin 323 provides electrical contact to contacts 215 and 216. Also shown are insulator 213 (typically, a one-micron thick layer of silicon oxide, aluminum oxide, polyimide, or other suitable insulator), and excitation strip 212 (typically, a one-micron thick layer of high-conductivity material, such as copper or an alloy of copper).

In the embodiment shown in FIG. 3B, a bilayer structure 330 made from high-resistivity soft ferromagnetic layer 317 and low-resistivity ferromagnetic layer 318, is included in soft layer 303 for use in improving the performance characteristics of the spin-valve magnetoresistive device (e.g., a saturation-excited spin-valve magnetoresistance SESVMR sensor 200). In general, bilayer structure 330 includes a thick layer (5–1000 nm) having a high-resistivity soft ferromagnetic material (e.g., high-resistivity soft ferromagnetic layer 317), that is adjacent to a thinner layer (0.2–100 nm) of a low-resistivity ferromagnetic material (e.g., low-resistivity ferromagnetic layer 318). These two layers (the "bilayer" 330) are coupled ferromagnetically at their interface, causing them to possess the same magnetization direction. The high-resistivity material, layer 317, is designed to have extremely soft magnetic properties which causes the bilayer 330 to rotate easily in response to applied (e.g., external) magnetic fields. In one embodiment, a NiFeMo alloy(typically 80% Ni, 16% Fe, and 4% Mo) is used for the high-resistivity material. In another embodiment, Fe—Si is used. In yet other embodiments, other related alloys are used. The low-resistivity material, layer 318, is made of a material known to enhance spin valve magnetoresistance, such as Co or Co—Fe alloys. It is believed that the high-resistivity soft ferromagnetic layer 317 reduces conductivity, particularly for spin-independent electrons, thus increasing the GMR $\Delta R/R$ percentage due to spin-dependent electrons.

Figure 4A:
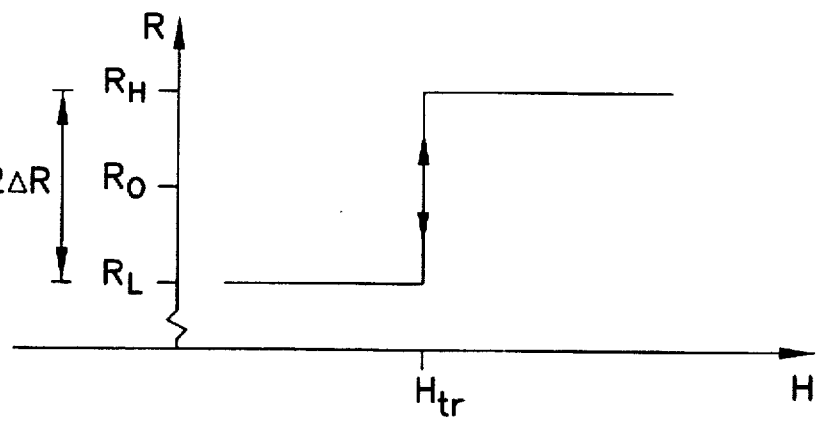
FIG. 4A shows an idealized curve of resistance R versus magnetic field H.

FIG. 4A shows an idealized curve of resistance R versus magnetic field H for a MR strip 211. As H is changed across a transition field strength, denoted $H_{tr}$, the resistance will change by an amount denoted 2 $\Delta R$. The average resistance of MR strip 211 is denoted $R_0$, which is typically one-half way between the low resistance $R_L$ and the high resistance RH values. It is typically desired to maximize GMR percentage $\Delta R/R_0$.

Figure 4B:
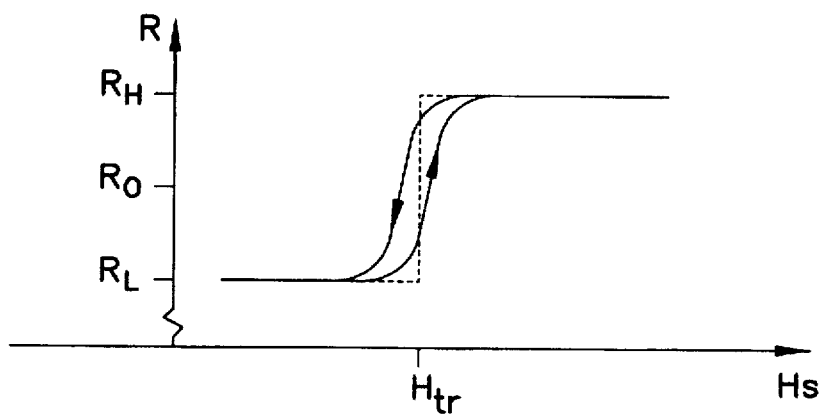
FIG. 4B shows a typical actual curve of resistance R versus magnetic field H.
Figure 4C:
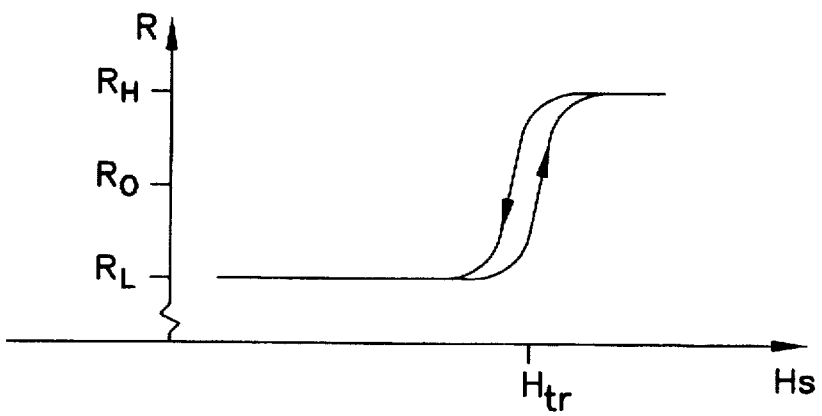
FIG. 4C shows another typical actual curve of resistance R versus magnetic field H, with a DC shift in H.
Figure 4D:
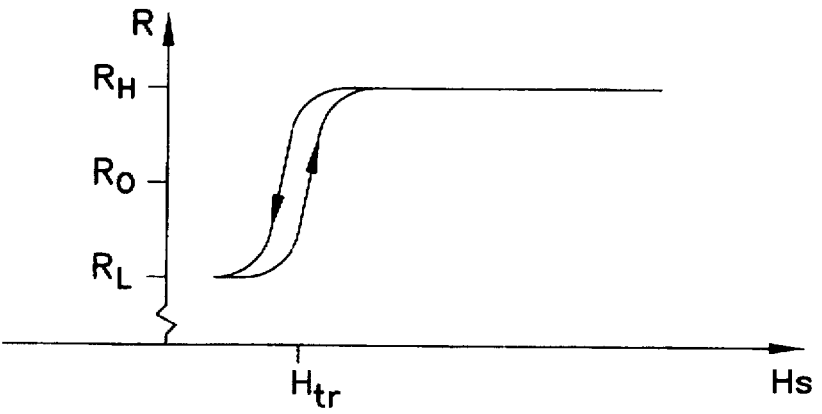
FIG. 4D shows another typical actual curve of resistance R versus magnetic field H, with a different DC shift in H.
Figure 5E:
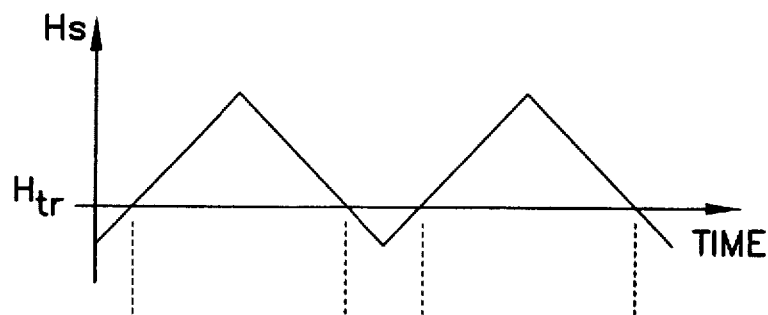
FIG. 5E shows a graph of the sensed magnetic field $H_s$ varying with time due to the excitation field $H_{DRIVE}$ varying with time as a triangle wave, and with a different DC shift in H.

FIG. 4B shows a typical actual curve of resistance R versus magnetic field H. In comparison to the ideal curve shown in FIG. 4A, the curve of 4B shows some rounding on the corners of the transition, and some horizontal distance, called "hysteresis", between the curve going "up" as H increases across $H_{tr}$, and the curve going "down" as H increases across $H_{tr}$. If, as shown in FIG. 4B, the sensed magnetic field, $H_s$, is driven to be a triangle wave centered on $H_{tr}$ (see FIG. 5A, with the sensed magnetic field $H_s$ varying with time due to the excitation field $H_{DRIVE}$ varying with time as a triangle wave), then the amount of time spent in the high-resistance state $R_H$ will equal the amount of time spent in the low-resistance state $R_L$ (see FIG. 5B, with the sensed resistance $R_s$ varying with time as a square wave—due to the field $H_s$ passing above and below $H_{tr}$,—). In other embodiments, wave forms other than triangle waves are used. The DC voltage 244 is used to position the driving field $H_{DRIVE}$ to be symmetric around the natural transition field $H_{tr}$ when $H_{ap}=0$. If however, as shown in FIG. 4C, the sensed magnetic field, $H_s$,is driven to be a triangle wave with a DC shift relative to $H_{tr}$ (see FIG. 5C, with the sensed magnetic field $H_s$ varying with time due to the excitation field $H_{DRIVE}$ varying with time as a triangle wave and shifted down by $H_{ap}$), then the amount of time spent in the high-resistance state $R_H$ will be less than the amount of time spent in the low-resistance state $R_L$ (see FIG. 5D). Correspondingly, as shown in FIG. 4D, if the sensed magnetic field, $H_s$ is driven to be a triangle wave with a DC shift in the opposite direction as that shown in FIG. 4C relative to $H_{tr}$ (see FIG. 5E), then the amount of time spent in the high-resistance state $R_H$ will be more than the amount of time spent in the low-resistance state $R_L$ (see FIG. 5F).

Figure 5F:
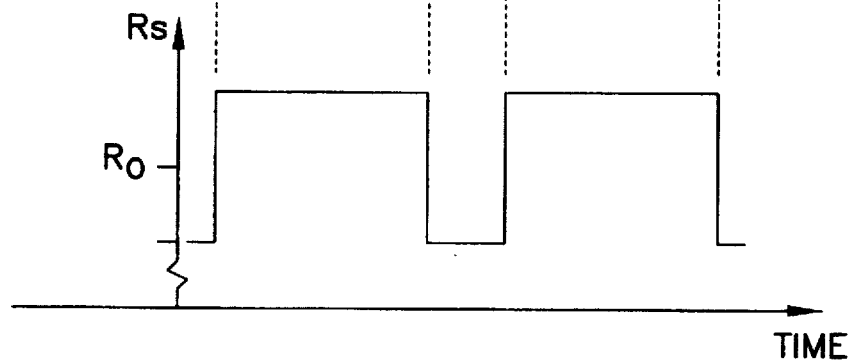
FIG. 5F shows a graph of the sensed resistance $R_s$ varying with time as a square wave—due to the field $H_s$ passing above and below $H_{rr}$ corresponding to FIG. 5E.
Figure 6A:
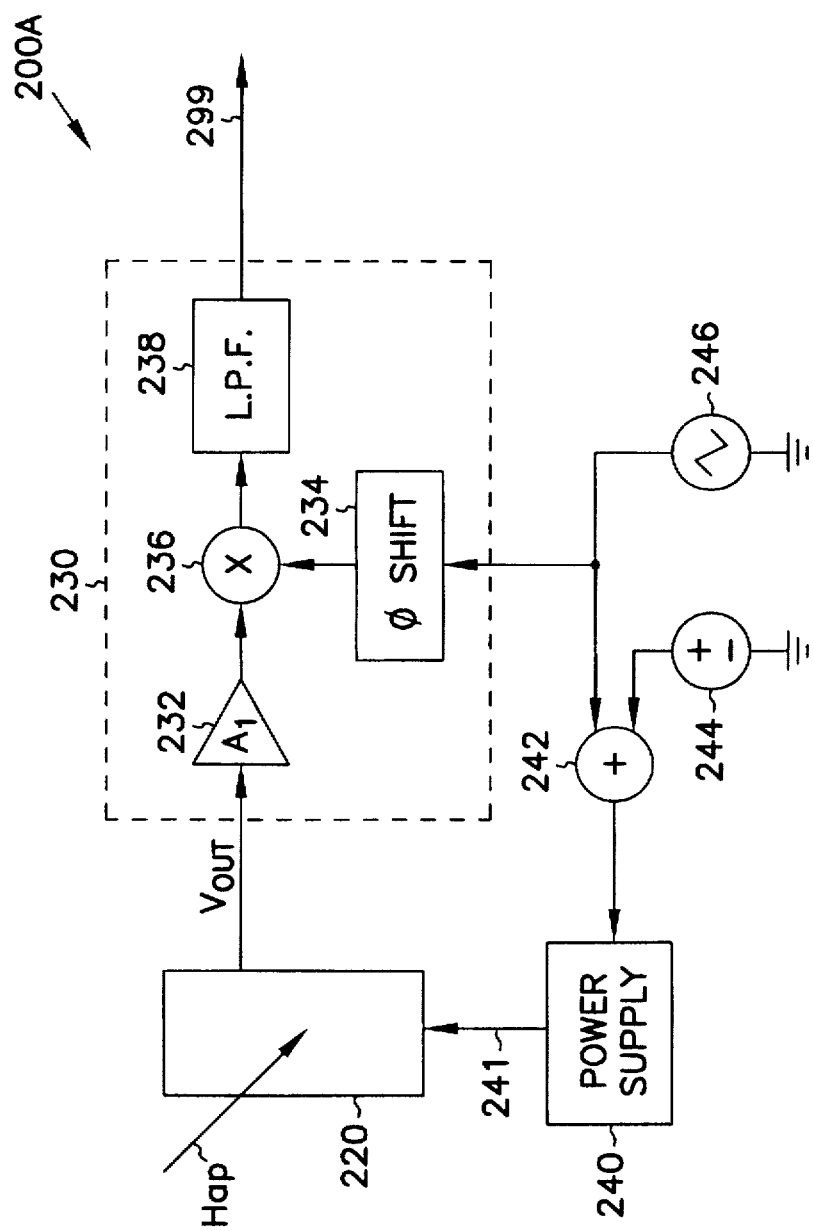
FIG. 6A shows a block diagram of one SESVMR sensor 200A according to one embodiment of the present invention.

FIG. 6A shows a block diagram of one typical SESVMR sensor 200A according to one embodiment of the present invention. MR sensor element 220 generates a signal $V_{OUT}$ which is similar to that shown in FIGS. 5B, 5D, and 5F. In addition, MR sensor element 220 is driven by an excitation signal 241, which generates excitation magnetic field $H_{DRIVE}$. Signal $V_{OUT}$ is amplified by amplifier 232, and then drives two-omega mixer 236. Two-omega mixer 236 is also driven by a signal from signal generator 246 as shifted by phase shifter 234. In one embodiment, phase shifter 234 is omitted. In the embodiment shown in FIG. 6A, phase shifter 234 helps to reduce undesirable effects from hysteresis in MR sensor element 220. In one embodiment, signal generator 246 produces a triangle-wave voltage signal which is added by added circuit 242 to a DC voltage generated by DC source 244, and then passed to power supply 240. In one embodiment, a KEPCO bipolar power supply BOP 36-6 is used for power supply 240. In one embodiment, an EG&G PARC model 124 lockin amplifier is used for lockin amplifier 230 (to replace the amplifier 232, mixer 236, phase shifter 234, and LPF 238). The output signal from two-omega mixer 236 is then processed by low-pass filter 238 which removes substantially all the alternating-current (AC) components (for example, those components above 10 hertz), and passes a "pseudo-" direct-current (DC) component to output signal 299. The pseudo-DC output signal 299 is called pseudo-DC because it will change in proportion to the measured magnetic field $H_{ap}$. For example, in a compass system 100 to be used in a vehicle whose direction changes rapidly, such as a helicopter, it may be desirable to pass a rate of change to the pseudo-DC output signal 299 which accurately reflects the orientation of compass system 100 as it moves or rotates. In one embodiment, a plurality of the components of SESVMR sensor 200A are integrated onto a single integrated circuit or integrated circuit module.

Figure 6B:
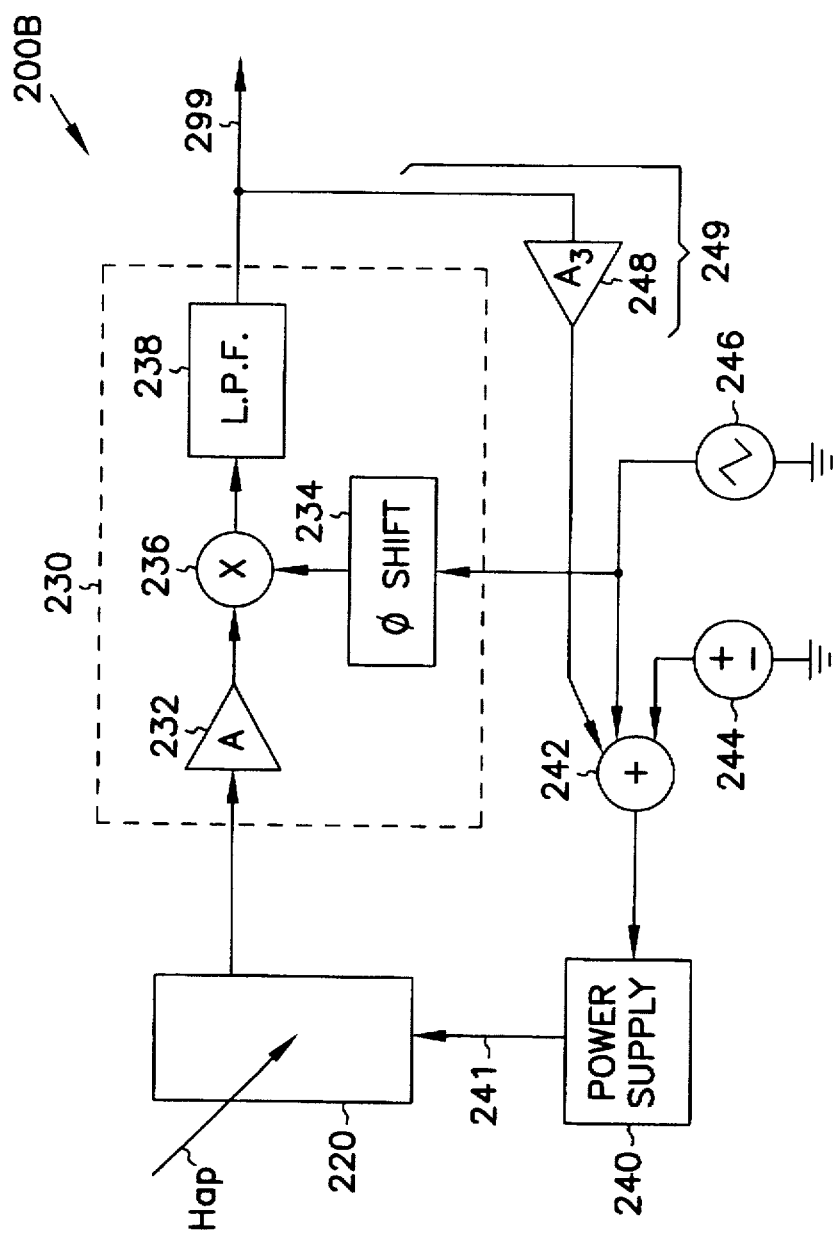
FIG. 6B shows a block diagram of one SESVMR sensor 200B according to another embodiment of the present invention.

FIG. 6B shows a block diagram of another typical SES-VMR sensor 200B that includes a feedback loop 249 from the output of LPF 238 through amplifier 248 and into adder circuit 242, according to the present invention. All other components of SESVMR sensor 200B are substantially identical to the corresponding components of SESVMR sensor 200A. Feedback loop 249 takes a pseudo-DC signal proportional to the output of LPF 238 (and thus proportional to the applied field $H_{ap}$) and in turn generates a counteracting field component $H_0$ added to the excitation field that counteracts the applied field $H_{ap}$. Some of the purposes of counteracting the applied field $H_{ap}$ include keeping the SESVMR sensor 200 in an optimal sensing operating region (in terms of sensitivity and linearity), to compensate for variations in circuit gain, and to compensate for temperature-related sensitivities of MR sensor element 220 and other circuit components. In one embodiment, a plurality of the components of SESVMR sensor 200B are integrated onto a single integrated circuit or integrated circuit module.

Figure 6C:
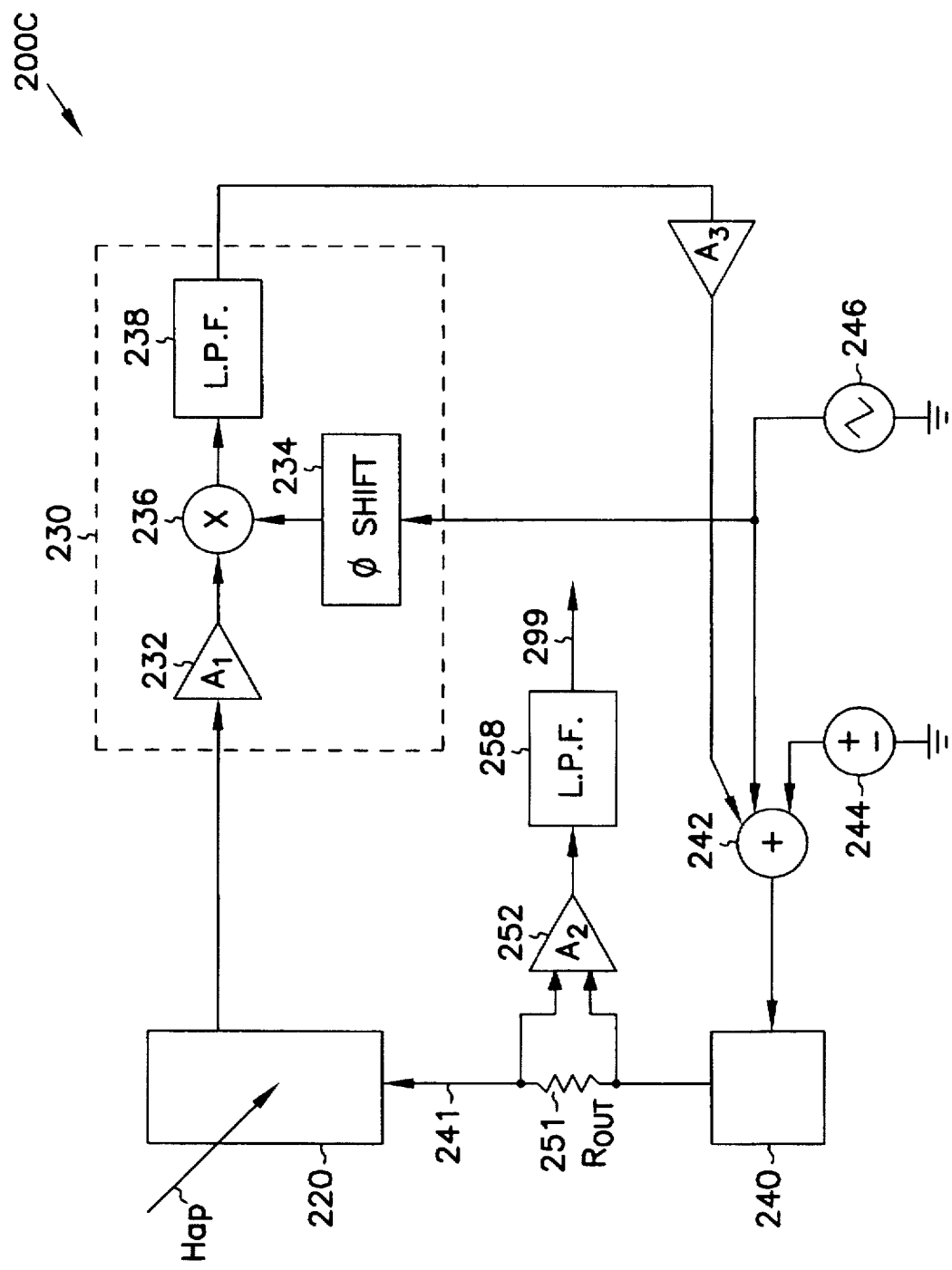
FIG. 6C shows a block diagram of one SESVMR sensor 200C according to yet another embodiment of the present invention.

FIG. 6C shows a block diagram of another typical SES-VMR sensor 200B that derives pseudo-DC output signal 299 from a voltage drop across resistor $R_{out}$ 251 as amplified by amplifier 252 and filtered by low-pass filter 258. All other components of SESVMR sensor 200C are substantially identical to the corresponding components of SESVMR sensor 200B. By deriving pseudo-DC output signal 299 from excitation signal 241 rather than from the output of LPF 238, certain undesirable gain-dependent or temperature features are reduced or eliminated, thus providing a more stable and accurate pseudo-DC output signal 299. In one embodiment, a plurality of the components of SESVMR sensor 200C are integrated onto a single integrated circuit or integrated circuit module.

In one embodiment, in order to produce a signal proportional to the applied field, SESVMR 200 is excited with:

$$H_{DRIVE} = H_{BIAS} + H_{EX} TRI(\omega t),$$

then $$R = R_0 + \Delta R \; SGN(H_{ap} + H_{BIAS} + H_{EX} TRI(\omega t) - H_{tr}) = R_0 + \Delta R \; SGN(TRI(\omega t) + h),$$

where:

$R_0$=midpoint resistance $\Delta R$=one half of the GMR resistance change $H_s$=magnetic field experienced by the sensing element= $H_{ap} + H_{DRIVE}$ $H_{tr}$=magnetic field at which sensor resistance changes, typically 5 Oe SGN(H)=sign function which equals 1 if H>0 and −1 if H<0

$H_{DRIVE}$=drive magnetic field produced by magnet coils $H_{EX} TRI(\omega t)$=oscillating excitation magnetic field used to drive the sensor to saturation every cycle $H_{BIAS}$=drive DC magnetic field designed to be close to $H_{tr}$ $TRI(\omega t)$=triangle wave signal in phase with $\cos(\omega t)$, with range (−1,1)

$H_{ap}$=external applied magnetic field to be measured h=a dimensionless magnetic field value representing reduced derivation between sensor field and transition field=$(H_s(DC) - H_{tr})/H_{EX}$ The DC portion of the SGN function will be linearly proportional to $H_{ap}$, since positive $H_{ap}$ will cause the argument to be positive for longer periods of time.

Notice: (a) $H_{ap}$ is now insensitive to $R_0$ temperature drift.

(b) Small $H_{EX}$ desired for large sensitivity, since this term is in the denominator.

(c) Because of limited linearity and stability, one should add feedback.

In one embodiment, this DC portion is measured (the "DC TECHNIQUE"):

$$R(DC) = R_0 + \Delta R \int_0^{2\pi} d(\omega t) SGN(TRI(\omega t) + h)$$

where the integral is over one period of excitation $$R(DC) = R_0 + (\Delta R/2\pi) \int_0^{2\pi} d(\omega t) SGN(TRI(\omega t) + h)$$

which equals $R(DC) = R_0 + (\Delta R/2\pi) ((1)((\pi/2 + h\pi/2) - (-\pi/2 - h\pi/2)) + (-1))3\pi/2 - h\pi/2) - (\pi/2 + h\pi/2))$ where the (1) term represents the high-state resistance value and its multiplicand represents the time in the high state, and the (−1) term represents the low-state resistance value and its multiplicand represents the time in the low state. This holds as long as −1<h<1. For |h|>1, R(DC) saturates at $R_0 \pm \Delta R$.

CALCULATION FOR DC SIGNAL $$R(DC) = R_0 + (\Delta R/2\pi) \int_0^{2\pi} d(\omega t) SGN(TRI(\omega t) + h)$$

$R(DC) = R_0 + \Delta R \; h$ for h<1

$V_{OUT(DC)} = I \; \Delta R \; (H_{ap} + H_{BIAS} - H_{tr})/H_{EX} + I \; R_0$     Equation 1

The desired signal $V_{OUT}$ is therefore proportional to $H_{ap}$, which can be easily measured using Equation 1. However, drift in $R_0$ or $\Delta R$ will drastically affect the DC measured $H_{ap}$, limiting the sensitivity.

In other embodiments, such as are shown in FIGS. 6A, 6B or 6C, the 2nd frequency component is measured instead of the DC component (the "two-omega ($2\omega$) technique"). This reduces the sensitivity to drift in the magnitude of $R_0$. The two-omega mixer 236 (see, e.g., FIGS. 6A, 6B or 6C) is used to extract a two-omega signal proportional to the external applied magnetic field $H_{ap}$ which is the external applied magnetic field to be measured.

CALCULATION FOR 2ω TECHNIQUE $$R(\cos(2\omega t)) = (\Delta R/2\pi) \int_0^{2\pi} d(\omega t) \text{SGN}(TRI(\omega t) + h)\cos(2\omega t)$$

$$R(\cos(2\omega t)) = (\Delta R/2\pi) \left( \int_{-\pi/2 - h\pi/2}^{\pi/2 + h\pi/2} d(\omega t)(+1)\cos(2\omega t) + \int_{\pi/2 + h\pi/2}^{3\pi/2 - h\pi/2} d(\omega t)(-1)\cos(2\omega t) \right)$$

$$R(\cos(2\omega t)) = (\Delta R/4\pi) \left( \{\sin(2\omega t)\}_{-\pi/2 - h\pi/2}^{\pi/2 + h\pi/2} - \{\sin(2\omega t)\}_{\pi/2 + h\pi/2}^{3\pi/2 - h\pi/2} \right)$$

R (cos (2ωt))=(ΔR/4π) (sin (π+hπ)−sin (−π−hπ)−sin (3π−hπ)+sin (π+hπ))

R (cos (2ωt))=(ΔR/4π) (2 sin (π+hπ)−2 sin (−π−hπ))

R (cos (2ωt))=(ΔR/π) sin (π+hπ)

R (cos (2ωt))=(ΔR/π) sin (hπ) as long as h<1

R (cos (2ωt))=ΔR h for h<<1←desired operation for maximum sensitivity and linear region

CALCULATION FOR 2ω SIGNAL $$R(\cos(2\omega t)) = (\Delta R/2\pi) \int_0^{2\pi} d(\omega t) \text{SGN}(TRI(\omega t) + h)\cos(2\omega t)$$

R (cos (2ωt))=(ΔR/π) sin (hπ) for h<1

R (cos (2ωt))=ΔR h for h<<1

$V_{OUT(2\omega)}$—I ΔR ($H_{ap}$+$H_{BIAS}$−$H_{rr}$)/$H_{EX}$    Equation 2

However, since the actual R versus H curve will display hysteresis (unlike FIG. 4A, but instead like FIG. 4B), there will be a phase delay Φ in the R value relative to the H value, shifting the transition points for the integration:

$R(\cos(2\omega t)) =$ $$(\Delta R/4\pi) \left( \{\sin(2\omega t)\}_{-\pi/2 - h\pi/2 + \Phi}^{\pi/2 + h\pi/2 + \Phi} - \{\sin(2\omega t)\}_{\pi/2 + h\pi/2 + \Phi}^{3\pi/2 - h\pi/2 + \Phi} \right)$$

R (cos (2ωt))=(ΔR/4π) (sin (π+hπ+2Φ)−sin (−π−hπ+2Φ)−sin(3π−hπ+2Φ)+sin (π+hπ+2Φ))

R (cos (2ωt))=(ΔR/4π) (2 sin (π+hπ+2Φ)−2 sin (−π−hπ+2Φ))

R (cos (2ωt))=(ΔR/2π) (sin (π+hπ+2Φ)+sin (π+hπ−2Φ))

R (cos (2ωt))=(ΔR/π) sin (hπ) cos (2Φ) as long as h<1

R (cos (2ωt))=(ΔR h cos (2Φ)) for h<<1 1

As long as Φ<30 degrees, the signal will only degrade by less than half. The Φ value can be kept small by adjusting the "lockin" phase shift of phase shifter 234. The optimum phase will give the maximum signal for a h<>0 state.

Notice that the Hap result is now independent of $R_0$, reducing the temperature dependence of the result considerably. However, the result will still vary if ΔR is varying (because of temperature fluctuations), $H_{BIAS}$ or $H_{EX}$ is varying (due to an imperfect drive oscillator, power supply, or magnet coils), or Φ is varying (due to Barkhausen noise). Another problem is the limited range of linearity.

These limitations can be partly overcome by using feedback to keep the R(cos(2ωt)) component as close to zero as possible. Then the input to the magnet controller will be proportional to the field required to keep the hysteresis loop in a symmetrical state.

Figure 7:
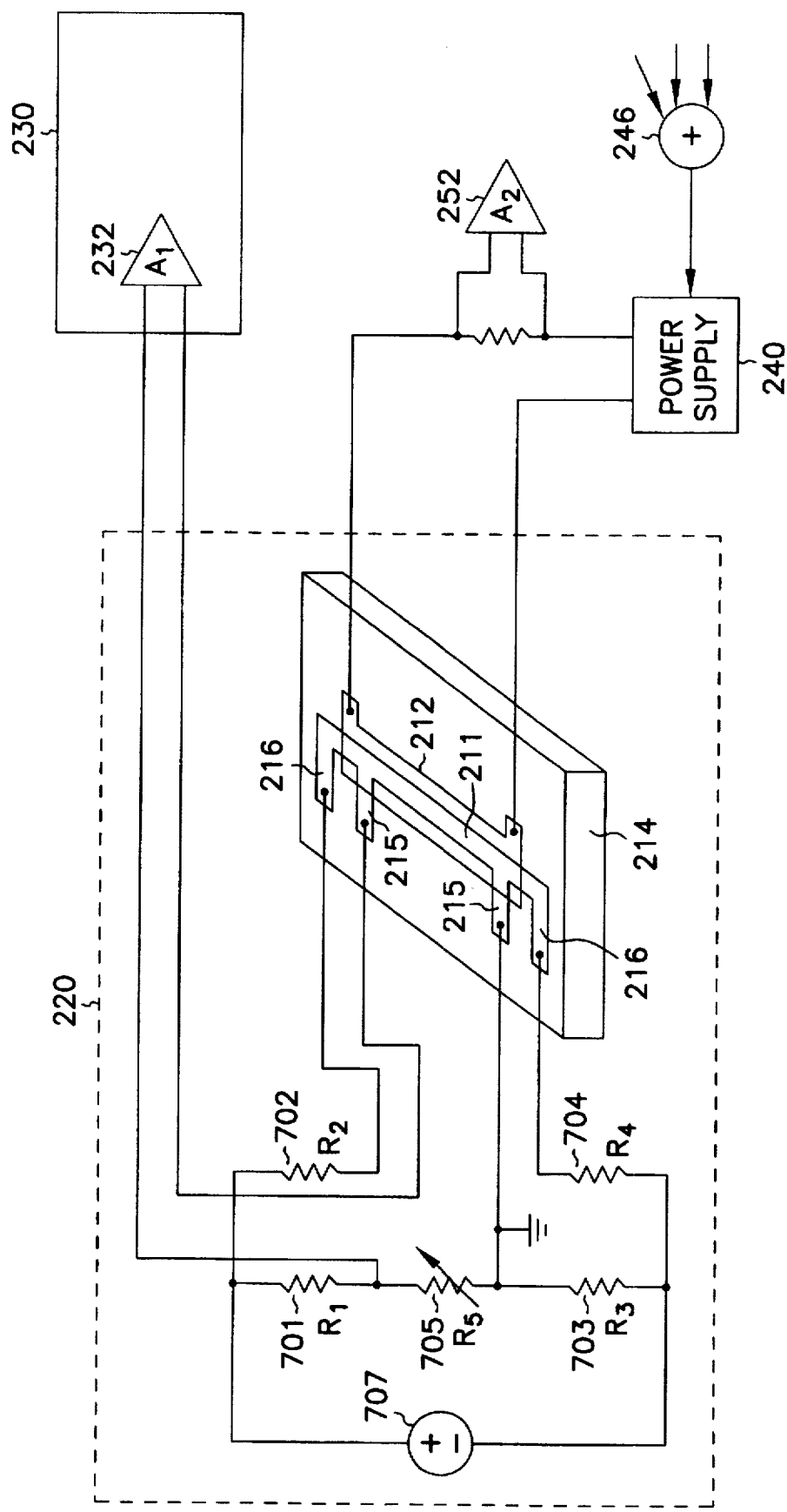
FIG. 7 shows circuit detail for one embodiment of MR sensor 220.

FIG. 7 shows circuit detail for one embodiment of SESVMR sensor 220 including a MR sensor element 210 such as is shown in FIG. 2A. In this embodiment, MR strip 211 is driven with a Wheatstone-bridge-type circuit, designed to provide a relatively constant current through terminals 216. Electric source 707 (in one embodiment, electric source 707 is a constant-current source) is coupled through resistor R2 702 to one terminal 216 of MR strip 211 and on to R4 704 which is coupled to the other node of electric source 707, thus forming two legs of the Wheatstone bridge. In one embodiment, electric source 707 provides a DC signal. In another embodiment, it provides a an AC excitation signal. The other pair of legs of the Wheatstone bridge is formed by resistor R1 701, and by series resistors R5 705 and R3 703. The node between R5 705 and R3 703 is connected to ground and to one of the voltage-sensing terminals 215 of MR strip 211. The node between R1 701 and R5 705 is connected to one input of differential amplifier 232, and the other input of differential amplifier 232 is connected to node between the other voltage-sensing terminal 215 of MR strip 211 and R5 705 and R3 703. In one embodiment, R1 701, R2 702, R3 703, and R4 704 are selected to be equal, and in one embodiment are selected to by 500 ohms. In this embodiment, R5 is selected to be equal to the $R_0$ resistance of MR strip 211.

Figure 8A:
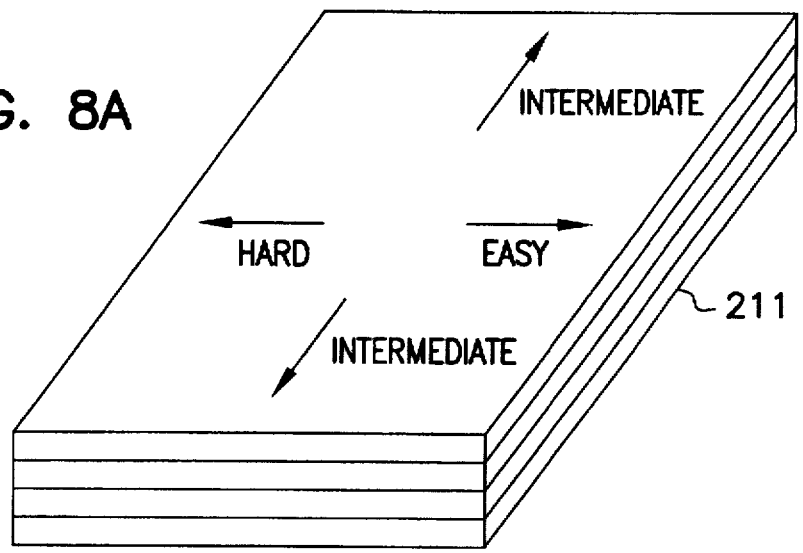
FIG. 8A shows an example of unidirectional anisotropy.
Figure 8B:
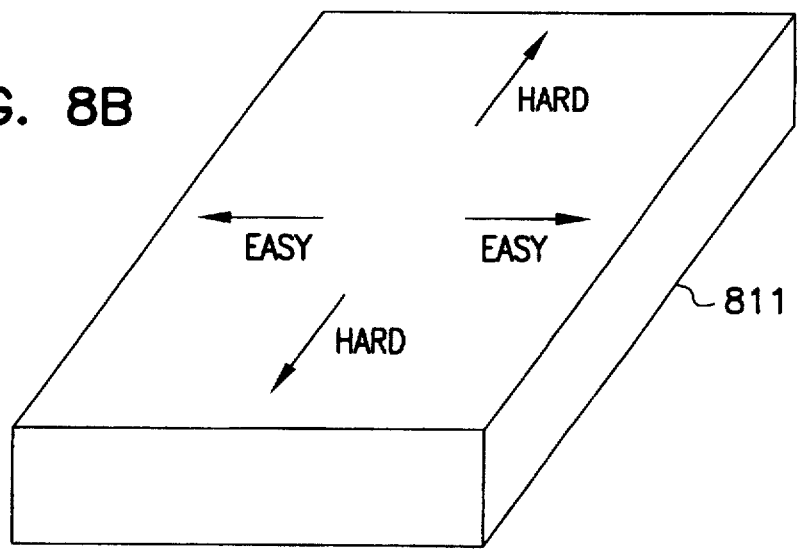
FIG. 8B shows an example of uni-axial anisotropy.

One feature of the present invention is the excitation to saturation of the pinned-layer spin-valve material of MR strip 211. This pinned-layer spin-valve material has a unidirectional anisotropy as shown in FIG. 8A (e.g., the positive x direction is "easy" and thus is the preferred direction of magnetization, the negative x direction is "hard" and a high-energy state, the positive and negative y directions provide an intermediate energy state). In contrast, a material 811 having uni-axial anisotropy is shown in FIG. 8B (e.g., the positive x and negative x directions are "easy" and thus is the preferred directions of magnetization, while the positive and negative y directions are hard and provide an high energy state and are therefore not preferred).

Figure 9:
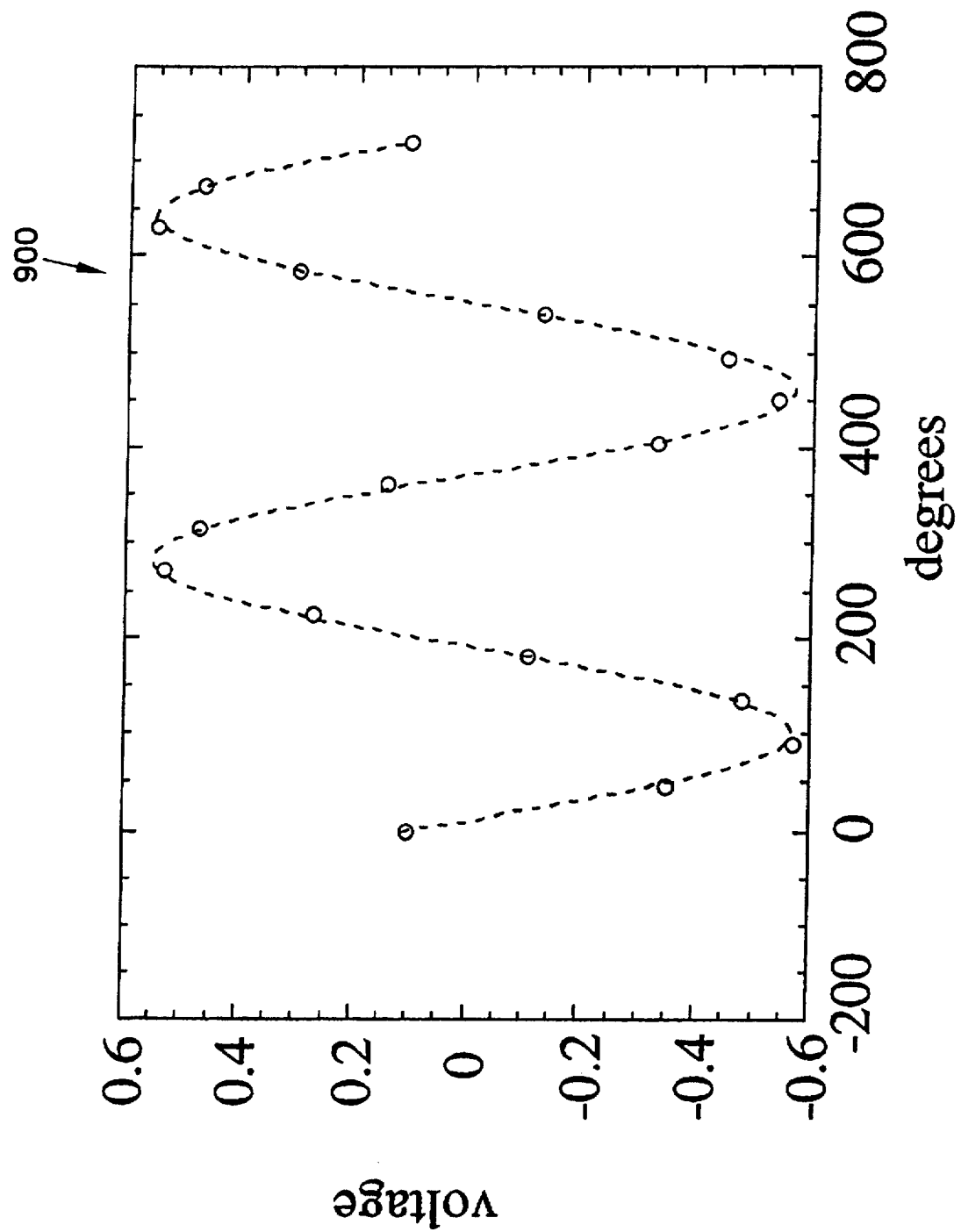
FIG. 9 shows an exemplary graph of the voltage versus orientation in a geomagnetic field for a SESVMR sensor 200.

FIG. 9 shows an exemplary graph 900 of the voltage versus orientation in a geomagnetic field for a SESVMR sensor 200.

One main feature of the present invention is for the use of the pinned-layer spin-valve magnetoresistance structure together with an oscillating excitation field which allows measurement of fields much smaller than $H_c$, the coercivity field. The present invention applies an oscillating excitation field large enough to saturate the magnetization in the directions parallel and antiparallel to the pinned layer direction, as shown in FIG. 4B. Then an external DC field will produce an offset in the excitation field experienced at the sensor, as shown in FIG. 4C. This changes the length of time the resistance is in the high state relative to the low state as shown in FIG. 5B, 5D, and 5F, which will cause a change in the average DC resistance value which is proportional to the applied field. The measurement of very weak fields is enabled because the measurements do not depend on the magnetic history of the device.

A sample with characteristics similar to those shown in FIG. 3B was excited with an applied field using a coil of several hundred turns about 8 cm in diameter. In other embodiments, a thin conducting strip over the sample to produce the excitation field, which will greatly reduces the size of the sensor. The excitation frequency was 23 Hz. The vertical scale is a voltage proportional to the change in resistance as the device is rotated relative to the earth's field. A low pass filter was used to remove the excitation field frequency. The noise value is calculated to be 0.0009 Oe.

One aspect of the novelty of the present invention is that the oscillating excitation field has not been used up till now for spin valve magneto resistive devices, to our knowledge. In the present invention, a thin film magnetization direction is sensed by a change in resistance, while in fluxgate devices, a macroscopic core's transition is sensed by an inductive pickup coil. There is also a difference in the type of signal produced from those produced by fluxgate devices. In fluxgate devices, the sensor produces the most useful AC signal during the transitional state. In the present technique, the key information is derived from the saturated state.

There are also differences between the present technique and the AMR approach described in U.S. Pat. No. 5,255,442. In the former, a square wave excitation signal is used, the magnetization is not driven to saturation, and the output is an AC signal. In the case of the present invention, a triangle wave excitation signal is used, the layers are driven to saturation, eliminating the possibility of hysteresis in the measurement, and the output is a DC change in resistance.

There are also differences between the technique of the present invention and conventional AMR approaches, such as described by Paperno et al. supra. They use excitation fields to drive the AMR sensor to saturation, then measure higher frequency harmonics of the excitation frequency. Using mathematical derivations, they show that the phase of the high frequency response is related to the external applied field. Their technique (which relies on variations in the phase of the output signal) is intrinsically more complicated than the approach of the present invention, which relies on changes in a DC voltage (which relies on the simple measurement of a single DC or AC component, e.g., a sine-wave component). The present invention's simpler approach is made possible by the use of GMR materials which have large changes in resistance between antiparallel magnetization states, which AMR materials do not possess.

The potential advantages of the technique of the present invention compared to fluxgate devices include size, power, and sensor complexity. The advantages compared to other GMR schemes include greater sensitivity to weak magnetic fields. Applications for this device include compasses, attitude sensors, and proximity sensors.

It is understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A thin film magnetic compass comprising;

a substrate;

a pinned-layer spin-valve magnetoresistive device on the substrate forming a magnetic core;

an excitation strip on the magnetoresistive device;

a driving circuit coupled to the excitation strip that provides a drive signal for producing an oscillating magnetic field that drives the magnetic core into magnetic saturation using the excitation strip and then allows the magnetic core to come out of saturation;

a sensing circuit that measures a sensor output signal from the magnetoresistive device the sensor output signal including a signal component representative of an external applied magnetic field.

2. The magnetic-field sensor of claim 1, wherein the excitation strip includes a conducting strip separated from the magnetoresistive device by an insulating layer.

3. The magnetic-field sensor of claim 1, wherein the drive signal oscillates as substantially a triangle wave.

4. The magnetic-field sensor of claim 1, wherein the drive signal oscillates about a total bias value.

5. The magnetic-field sensor of claim 4, wherein a feedback signal is coupled to the driving circuit to provide a feedback component that varies the total bias value so as to keep the sensing element in a range chosen to achieve sensitivity and/or linearity.

6. The magnetic-field sensor of claim 1, wherein the drive signal oscillates as substantially a triangle wave about the total bias value.

7. The magnetic field sensor of claim 6, wherein a feedback signal is coupled to the driving circuit to provide a feedback component that varies the total bias value so as to keep the sensing element in a range chosen to achieve sensitivity and/or linearity.

8. The magnetic-field sensor of claim 1, wherein the sensing circuit measures a time proportion representative of a ratio of a time that the magnetic-field sensor is in a first saturated state to a time that the magnetic-field sensor is in a second saturated state, and generates an output signal representative of the external applied magnetic field.

9. The magnetic-field sensor of claim 1, wherein the sensing circuit comprises a two-omega mixer.

10. The magnetic-field sensor of claim 1, further comprising an output circuit coupled to the drive signal, the output circuit including a low-pass filter that removes an oscillating signal component of the drive signal, and generates an output signal representative of the external applied magnetic field.

* * * * *